US008756558B2

(12) United States Patent
Toops et al.

(10) Patent No.: US 8,756,558 B2
(45) Date of Patent: Jun. 17, 2014

(54) FRAM COMPILER AND LAYOUT

(75) Inventors: David J. Toops, Lucas, TX (US); Michael P. Clinton, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 169 days.

(21) Appl. No.: 13/435,718

(22) Filed: Mar. 30, 2012

(65) Prior Publication Data
US 2013/0258751 A1 Oct. 3, 2013

(51) Int. Cl.
*G06F 17/50* (2006.01)
(52) U.S. Cl.
USPC .......................... 716/136; 716/104; 716/139
(58) Field of Classification Search
CPC ................................. G06F 17/50; G06F 15/04
USPC .......................................... 716/104, 136, 139
See application file for complete search history.

(56) References Cited

U.S. PATENT DOCUMENTS

| 7,461,371 | B2 | 12/2008 | Luo et al. |
| 7,587,699 | B2 * | 9/2009 | McCubbrey .................. 716/104 |
| 2004/0105296 | A1 | 6/2004 | Ho |
| 2005/0088887 | A1 | 4/2005 | Wang |
| 2008/0151598 | A1 | 6/2008 | Madan |
| 2010/0226162 | A1 | 9/2010 | Madan et al. |
| 2010/0246238 | A1 | 9/2010 | Taylor et al. |

FOREIGN PATENT DOCUMENTS

| KR | 1020030090072 | 11/2003 |
| KR | 1020080011025 | 1/2008 |

* cited by examiner

*Primary Examiner* — Thuan Do
(74) *Attorney, Agent, or Firm* — Alan A. R. Cooper; W James Brady, III; Frederick J. Telecky, Jr.

(57) ABSTRACT

A computer program for generating a layout for a ferroelectric random access memory (FRAM) that is embodied on a non-transitory storage medium and executable by a processor is provided. FRAM specifications are received, and an FRAM floorplan and design rules are retrieved from the non-transitory storage medium. The layout for the FRAM based on the FRAM specifications and design rules is then assembled.

15 Claims, 9 Drawing Sheets

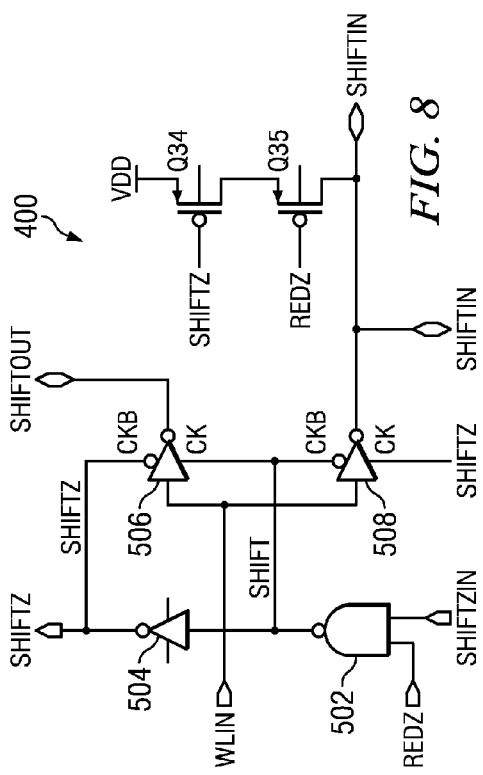
FIG. 8
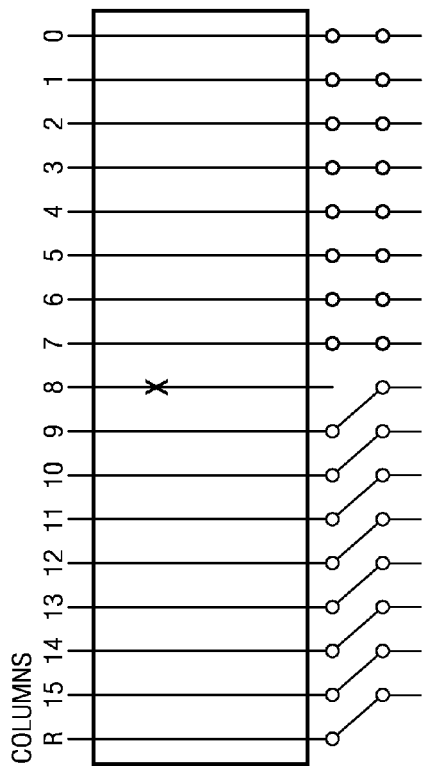
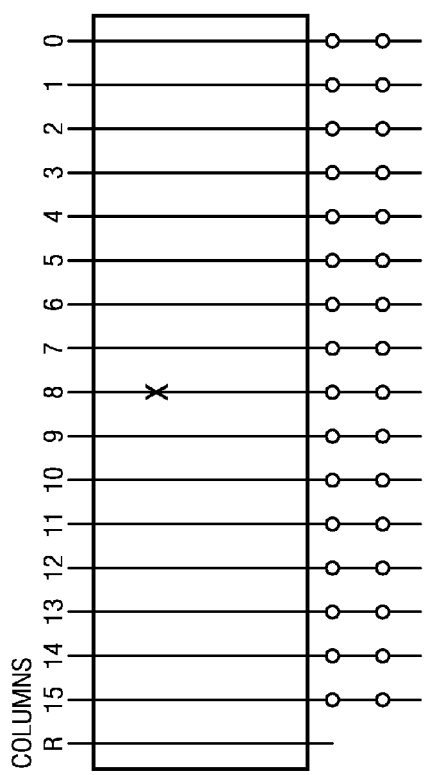
FIG. 9

| ROW DECODER 302 | ROW DRIVER 304 | ARRAY SEGMENT 310 | PLATE DRIVER 308 | ARRAY SEGMENT 310 | PLATE DRIVER 308 | ARRAY SEGMENT 310 | PLATE DRIVER 308 | ARRAY SEGMENT 310 | PLATE DRIVER 308 |
|---|---|---|---|---|---|---|---|---|---|
| | | SENSING CIRCUIT 316 | | SENSING CIRCUIT 314 | | SENSING CIRCUIT 314 | | SENSING CIRCUIT 314 | |
| ROW DECODER 302 | ROW DRIVER 304 | ARRAY SEGMENT 310 | PLATE DRIVER 308 | ARRAY SEGMENT 310 | PLATE DRIVER 308 | ARRAY SEGMENT 310 | PLATE DRIVER 308 | ARRAY SEGMENT 310 | PLATE DRIVER 308 |
| CONTROLLER 322 | | IO BUS 318 | | IO BUS 318 | | IO BUS 318 | | IO BUS 318 | |
| | | ECC LOGIC 320 | | ECC LOGIC 320 | | ECC LOGIC 320 | | ECC LOGIC 320 | |

| ROW DECODER 302 | ROW DRIVER 304 | ARRAY SEGMENT 310 | PLATE DRIVER 308 | ARRAY SEGMENT 310 | PLATE DRIVER 308 |
|---|---|---|---|---|---|
| 316 || SENSING CIRCUIT | 314 | SENSING CIRCUIT | 314 |
| ROW DECODER 302 | ROW DRIVER 304 | ARRAY SEGMENT 310 | PLATE DRIVER 308 | ARRAY SEGMENT 310 | PLATE DRIVER 308 |
| ROW DECODER 302 | ROW DRIVER 304 | ARRAY SEGMENT 310 | PLATE DRIVER 308 | ARRAY SEGMENT 310 | PLATE DRIVER 308 |
| 316 || SENSING CIRCUIT | 314 | SENSING CIRCUIT | 314 |
| ROW DECODER 302 | ROW DRIVER 304 | ARRAY SEGMENT 310 | PLATE DRIVER 308 | ARRAY SEGMENT 310 | PLATE DRIVER 308 |
| CONTROLLER 322 || IO BUS | 318 | IO BUS | 318 |
| ^ || ECC LOGIC | 320 | ECC LOGIC | 320 |

*FIG. 13*

FRAM COMPILER AND LAYOUT

TECHNICAL FIELD

The invention relates generally to ferroelectric random access memory (FRAM) and, more particularly, to a compiler for generating a layout for an FRAM.

BACKGROUND

Memory compilers are commonly used in designing static random access memory (SRAM) and dynamic random access memory (DRAM). With these memory compilers, a user is able to input design criteria for a memory (i.e., DRAM or SRAM array), and a computer system or personal computer (PC) that can automatically generate a layout for such a memory, which significantly reduces overhead in designing integrated circuits (ICs) that include SRAM or DRAM. FRAMs, on the other hand, that have not been designed using compliers due to complexities in design that are not generally amiable to use in compliers; as a result, FRAMs have traditionally been the focus of custom designs, which is time consuming and labor intensive. Therefore, there is a need for an FRAM compiler.

Some examples of conventional systems and/or circuits are: U.S. Pat. No. 7,461,371; U.S. Patent Pre-Grant Publ. No. 2005/0088887; and U.S. Patent Pre-Grant Publ. No. 2010/0226162.

SUMMARY

An embodiment of the present invention, accordingly, provides an apparatus. The apparatus comprises a first array segment having: an first array of ferroelectric memory cells arranged into a first set of rows and a first set of columns, wherein each row from the first set of rows is associated with at least one bitline from a first set of bitlines and at least one plateline from a first set of platelines, and wherein each column from the first set of columns is associated with at least one wordline from a first set of wordlines; and a first set of bitline cells, wherein each bitline is coupled to at least one bitline from the first set of bitlines; a second array segment having: an second array of ferroelectric memory cells arranged into a second set of rows and a second set of columns, wherein each row from the second set of rows is associated with at least one bitline from a second set of bitlines and at least one plateline from a second set of platelines, and wherein each column from the second set of columns is associated with at least one wordline from a second set of wordlines; and a second set of bitline cells, wherein each bitline is coupled to at least one bitline from the second set of bitlines; a sensing circuit that is located between the first array segment and the second array segment, wherein the second circuit includes a plurality of sense amplifiers, and wherein each sense amplifier is coupled to at least one bitline from the first set of bitlines and is coupled to at least one bitline from the second set of bitlines; a first plate driver that is coupled to each plateline from the first set of platelines and that is located substantially adjacent to the first array segment; a second plate driver that is coupled to each plateline from the second set of platelines and that is located substantially adjacent to the second array segment; a first row interface circuit that is coupled to each wordline from the first set of wordlines and that is located substantially adjacent to at least one of the first plateline drivers and the first array segment; a second row interface circuit that is coupled to each wordline from the second set of wordlines and that is located substantially adja-cent to at least one of the second plateline drivers and the second array segment; a wordline boost circuit that is coupled to the first and second row interface circuits and that is between the first and second row interface circuits; an input/output (IO) bus that is coupled to each sense amplifier and that is located substantially adjacent to at least one of the first and second array segments; an error correcting code (ECC) logic circuit that is coupled to and is substantially adjacent to the IO bus; and a controller that is coupled to the IO bus, the ECC logic, the sensing circuit, the first row interface circuit, and the second row interface circuit, wherein the controller is substantially adjacent to at least one of the first and second row interface circuits, the IO bus, and the ECC logic circuit.

In accordance with an embodiment of the present invention, each bitline cell further comprises a precharge circuit.

In accordance with an embodiment of the present invention, each bitline cell is coupled to a pair of bitlines, and wherein each bitline cell further comprises: the precharge circuit being coupled to its pair of bitlines; and a multiplexer that is coupled to the precharge circuit and its sense amplifier, wherein the multiplexer is controlled by the controller.

In accordance with an embodiment of the present invention, each bitline from the first and second sets of bitlines further comprises a true bitline and a complement bitline, and wherein each ferroelectric memory cell further comprises: a first MOS transistor that is coupled to its true bitline at its drain and its wordline at its gate; a first ferroelectric capacitor that is coupled between the source of the first MOS transistor and its plateline; a second MOS transistor that is coupled to its complement bitline at its drain and its wordline at its gate; and a second ferroelectric capacitor that is coupled between the source of the second MOS transistor and its plateline.

In accordance with an embodiment of the present invention, the ECC logic circuit further comprises: a plurality of syndrome generators that are coupled to receive an uncorrected read from the sensing circuit; a plurality of error corrector circuits; and a plurality of error corrector parity circuits, wherein the plurality of error corrector circuits and the plurality of error corrector parity circuits are coupled to the plurality of syndrome generators so as to generate a corrected read.

In accordance with an embodiment of the present invention, the first row interface circuit is adjacent to the first array segment, and wherein the second row interface circuit is adjacent to the second array segment.

In accordance with an embodiment of the present invention, a computer program for generating a layout for a ferroelectric random access memory (FRAM) that is embodied on a non-transitory storage medium and executable by a processor is provided. The computer program comprises computer code for receiving FRAM specifications; computer code for retrieving an FRAM floorplan and design rules from the non-transitory storage medium; and computer code for assembling the layout for the FRAM based on the FRAM specifications and design rules.

In accordance with an embodiment of the present invention, the FRAM specifications further comprise a word size, a bit length, byte size, and array segment layout.

In accordance with an embodiment of the present invention, the design rules further comprise: computer code for placing row interface circuitry along one edge of the layout; and computer code for placing a controller at one corner of the layout, wherein the controller is substantially adjacent to the row interface circuitry.

In accordance with an embodiment of the present invention, the floorplan further comprises an shared circuit and a scalable circuit.

In accordance with an embodiment of the present invention, a FRAM having a layout is provided. The FRAM comprises a shared circuit having: row interface circuitry located along an edge of the layout; and a controller that is coupled to the row interface circuitry, that is substantially adjacent to the row interface circuitry, and that is located at a corner of the layout; and a plurality of scalable circuits that are arranged in a array, wherein the array is adjacent to the row interface circuitry, wherein each scalable circuit includes: a first set of bitlines; a second set of bitlines; a first set of wordlines, wherein each wordline from the first set of wordlines is coupled to the row interface circuitry; a second set of wordlines, wherein each wordline from the second set of wordlines is coupled to the row interface circuitry; a first set of platelines; a second set of platelines; a first set of FRAM cells arranged into a first set of rows and a first set of columns, wherein each FRAM cell from the first set of FRAM cells is coupled to at least one bitline from the first set of bitlines, at least one wordline from the first set of wordlines, and at least one plateline from the first set of platelines; a second set of FRAM cells arranged into a second set of rows and a second set of columns, wherein each FRAM cell from the second set of FRAM cells is coupled to at least one bitline from the second set of bitlines, at least one wordline from the second set of wordlines, and at least one plateline from the second set of platelines; a first set of bitline cells, wherein each bitline is coupled to at least one bitline from the first set of bitlines; a second set of bitline cells, wherein each bitline is coupled to at least one bitline from the second set of bitlines; a plurality of sense amplifiers, wherein each sense amplifier is coupled to at least one bitline from the first set of bitlines and it coupled to at least one bitline from the second set of bitlines, and wherein each sense amplifier is located between the first and second sets of FRAM cells; a first plate driver that is coupled to each plateline from the first set of platelines and that is located substantially adjacent to the first set of FRAM cells; a second plate driver that is coupled to each plateline from the second set of platelines and that is located substantially adjacent to the second set of FRAM cells; an IO bus that is coupled to each sense amplifier and that is located substantially adjacent to at least one of the first and second sets of FRAM cells; and an ECC logic circuit that is coupled to and is substantially adjacent to the IO bus.

In accordance with an embodiment of the present invention, the first set of bitlines further comprises a first set of true bitlines and a first set of complement bitlines, and wherein the second set of bitlines further comprises a second set of true bitlines and a second set of complement bitlines.

In accordance with an embodiment of the present invention, each FRAM cell from the first and second sets of FRAM cells further comprises: a first NMOS transistor that is coupled to its true bitline at its drain and its wordline at its gate; a first ferroelectric capacitor that is coupled between the source of the first MOS transistor and its plateline; a second NMOS transistor that is coupled to its complement bitline at its drain and its wordline at its gate; and a second ferroelectric capacitor that is coupled between the source of the second MOS transistor and its plateline.

In accordance with an embodiment of the present invention, each bitline cell from the first and second sets of bitline cells further comprises: a precharge circuit that is coupled to true and complement bitlines from two adjacent rows in its associated set of FRAM cells; and a multiplexer that is coupled to the precharge circuit and its sense amplifier, wherein the multiplexer is controlled by the controller.

In accordance with an embodiment of the present invention, the row interface circuitry further comprises: a first row driver that is coupled to each first set of FRAM cells in a row of the array; a first row decoder that is coupled to the first row driver; a second row driver that is coupled to each second set of FRAM cells in the row of the array; and a second row decoder that is coupled to the second row driver; and a wordline boost circuit that is coupled to the first and second row drivers and that is located between the first and second row drivers.

In accordance with an embodiment of the present invention, the ECC logic circuit further comprises: a plurality of syndrome generators that are coupled to receive an uncorrected read from its sensing circuit; a plurality of error corrector circuits; and a plurality of error corrector parity circuits, wherein the plurality of error corrector circuits and the plurality of error corrector parity circuits are coupled to the plurality of syndrome generators so as to generate a corrected read.

In accordance with an embodiment of the present invention, each of the first and second row drivers further comprise a row shifting circuit.

In accordance with an embodiment of the present invention, the bit length for the FRAM is 64 bits.

In accordance with an embodiment of the present invention, the array is one of a 1×2 array of scalable circuits, a 1×4 array of scalable circuits, a 2×2 array of scalable circuits, a 1×8 array of scalable circuits, a 2×4 array of scalable circuits, a 4×2 array of scalable circuits, a 2×8 array of scalable circuits, a 4×4 array of scalable circuits, and a 4×8 array of scalable circuits having respective word sizes of 1024, 2048, 2048, 4096, 4096, 4096, 8192, 8192, and 16384 and having a respective size of 8 kb, 16 kb, 16 kb, 32 kb, 32 kb, 32 kb, 64 kb, 64 kb, 128 kb.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 is a diagram of an example of a row shift circuit employed in the row drivers of FIG. 3;

FIG. 9 is a diagram of an example of a column shift for the array segments of FIG. 3;

FIGS. 11-14 are diagrams of examples of FRAM memory circuits generated by the compiler of FIG. 2 using the floorplan of FIG. 3.

DETAILED DESCRIPTION

Figure 1:
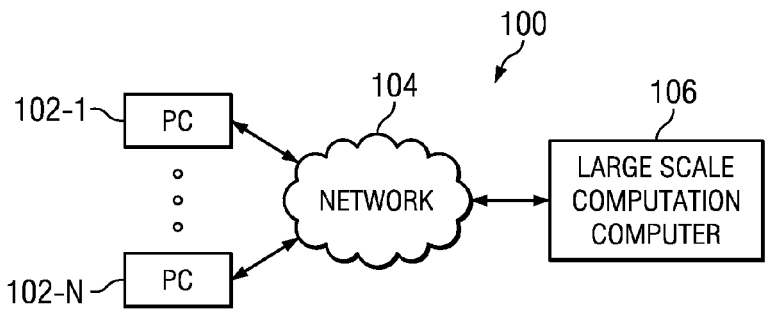
FIG. 1 is a diagram of an example of a computer system.

Refer now to the drawings wherein depicted elements are, for the sake of clarity, not necessarily shown to scale and wherein like or similar elements are designated by the same reference numeral through the several views.

Turning to FIG. 1, the reference numeral 100 generally designates a computer network. Network 100 generally comprises personal computers (PCs) or terminals 102-1 to 102-N, a packet switching network 104, and a large scale computation computer 106. Each of these computers 102-1 to 102-N and 106 include one or more processors and a storage medium (such as random access memories and hard disk drives), where the processor can execute computer program code or software instructions which are stored in the storage media. Circuit compilers (which are generally computer code or software instructions) generally take many forms and which can operate or be executed on one or more of the PCs 102-1 to 102-N or over the network 104.

Figure 2:
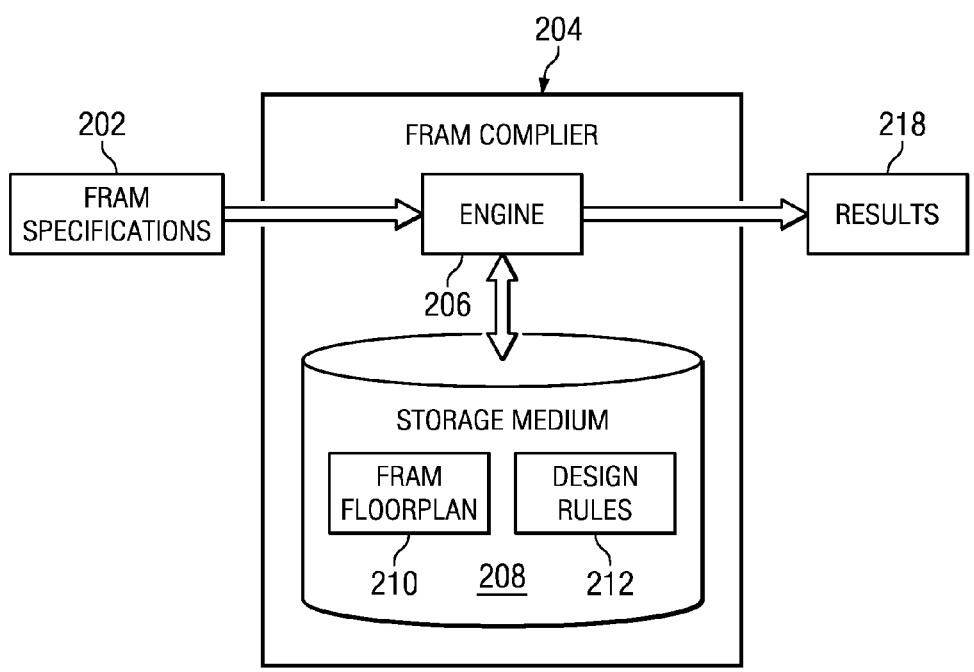
FIG. 2 is a diagram of an example of an FRAM compiler in accordance with the present invention, which can be used on the computer system of FIG. 1.

In FIG. 2, a generalized diagram of a FRAM compiler 204 is shown. This compiler 204 generally operates over one or more computers 102-1 to 102-N and 106 on computer network 100 so as to generate a layout for a FRAM memory circuit. Typically, a user is able to define FRAM specifications (such as word size, bit length, total size, and layout aspect ratio). The engine 206 is able to retrieve an FRAM floorplan 210 retrieved from a storage medium 208 (such as a hard disk drive), and, based on the FRAM specifications 202 and design rules 212, the engine 206 is able to form an FRAM memory (generally for use in an integrated circuit or IC) as the results 218.

Figure 3:
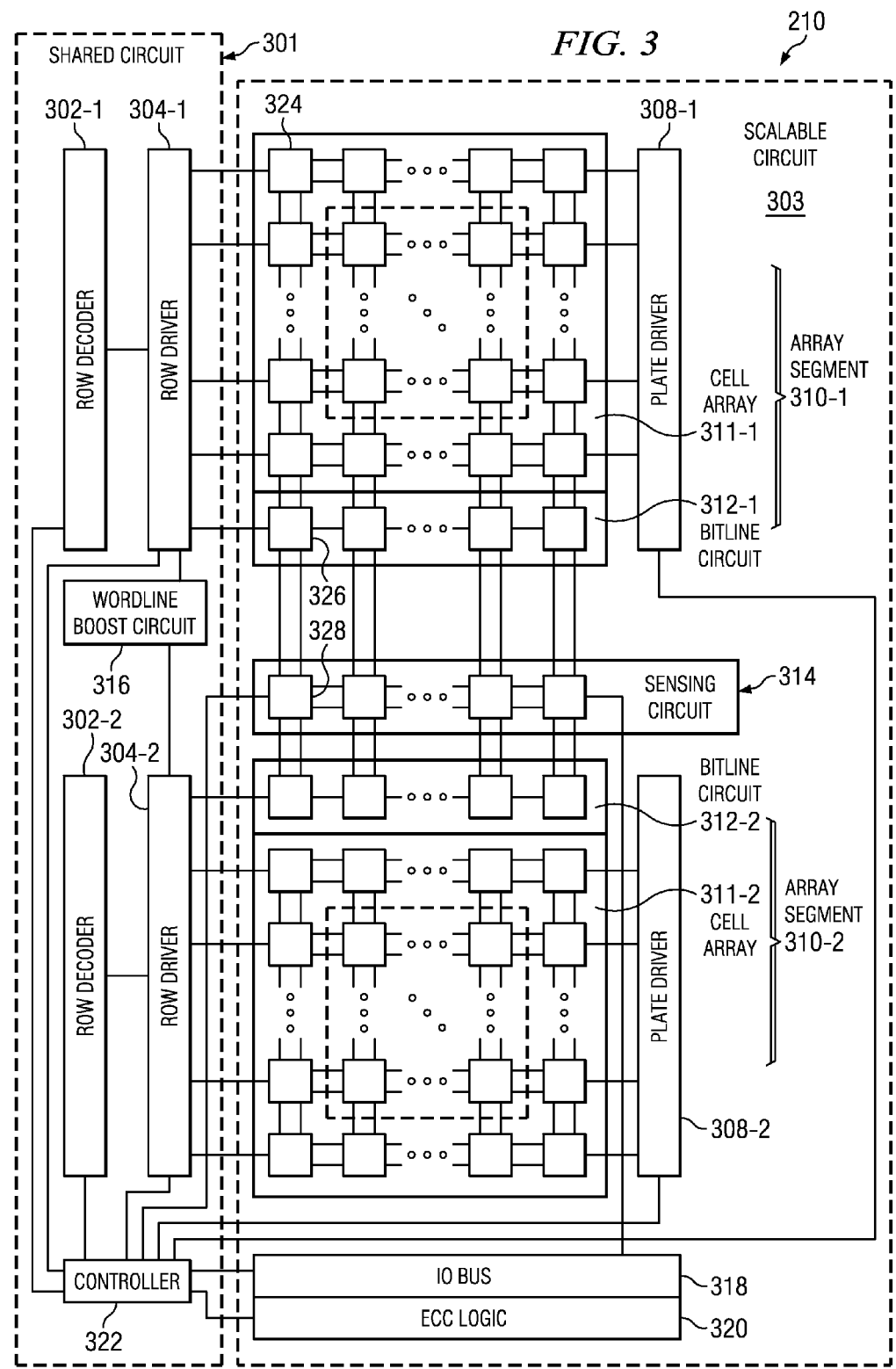
FIG. 3 is a diagram of an example of an FRAM floorplan.

The floorplan 210 (an example of which can be seen in FIG. 3) can set forth the general arrangement for an FRAM memory. As shown in the example of FIG. 3, the floorplan 210 has two components: the shared circuit 301 and the scalable circuit 303. The shared circuit 301 is generally formed of circuits that can be shared across scalable circuit 303 (and which can, in part, be described by design rules 212), while the scalable circuit 303 can be expanded to achieve the desired size, aspect ratio, and so forth. In the example shown in FIG. 3 (which depicts an example of a minimally sized FRAM memory circuit), the shared circuit 301 is located along one edge with a controller 322 at one corner and row interface circuitry (i.e., row interface circuits for the upper and lower array segments 310-1 and 310-2 and wordline boost circuit 316) being substantially adjacent to the controller 322. Each row decoder 302-1 and 302-2 and row driver 304-1 and 304-1 (for these row interface circuits) can be used to driver row for any number of array segments (i.e., 310-1 and 310-2) expanded horizontally. The scalable circuit 303 can, for example, be generally formed of pairs of array segments 310-1 and 310-2 (which are generally cell arrays 311-1 and 311-2 and bitline circuits 312-1 and 312-2) that share (and are substantially adjacent to) a sensing circuit 314 (which, for example, includes sense amplifiers 328) and that share an input/output (IO) bus 318 and an ECC logic circuit 320. The cell arrays 311-1 and 311-2 (which can, for example, be 32 bits wide) also generally include FRAM cells 324 arranged into an array of rows and columns, and bitline circuits 312-1 and 312-2 and generally include bitline cells 326. There is also a plate driver 308-1 and 308-2 associated with each cell array 311-1 and 311-2.

Figure 4:
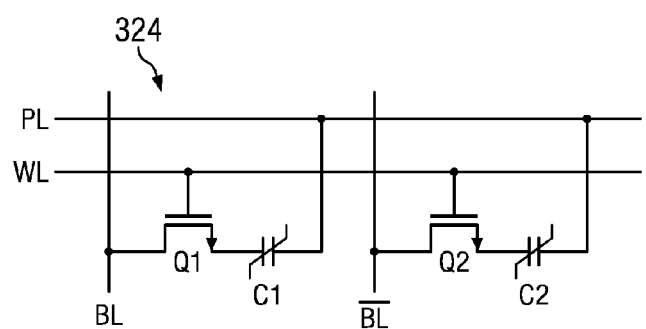
FIG. 4 is a diagram of an example of an FRAM cell of FIG. 3.

Turning to FIG. 4, an example of FRAM cell 324 can be seen. As shown, the FRAM cell 324 is generally formed of transistors Q1 and Q2 (which, as shown, are NMOS transistors) that are coupled to true and complement bitlines BL and $\overline{BL}$, respectively. Transistors Q1 and Q2 also share a plateline PL that is generally coupled to its plate line driver (i.e., 308-1 or 308-2) and share a wordline WL that is generally coupled to its row driver (i.e., 304-1 or 304-2). These transistors Q1 and Q2 can then be used to control or assist in reading the state of ferroelectric capacitors C1 and C2 or in the writing of a state to ferroelectric capacitors C1 and C2.

Figure 5:
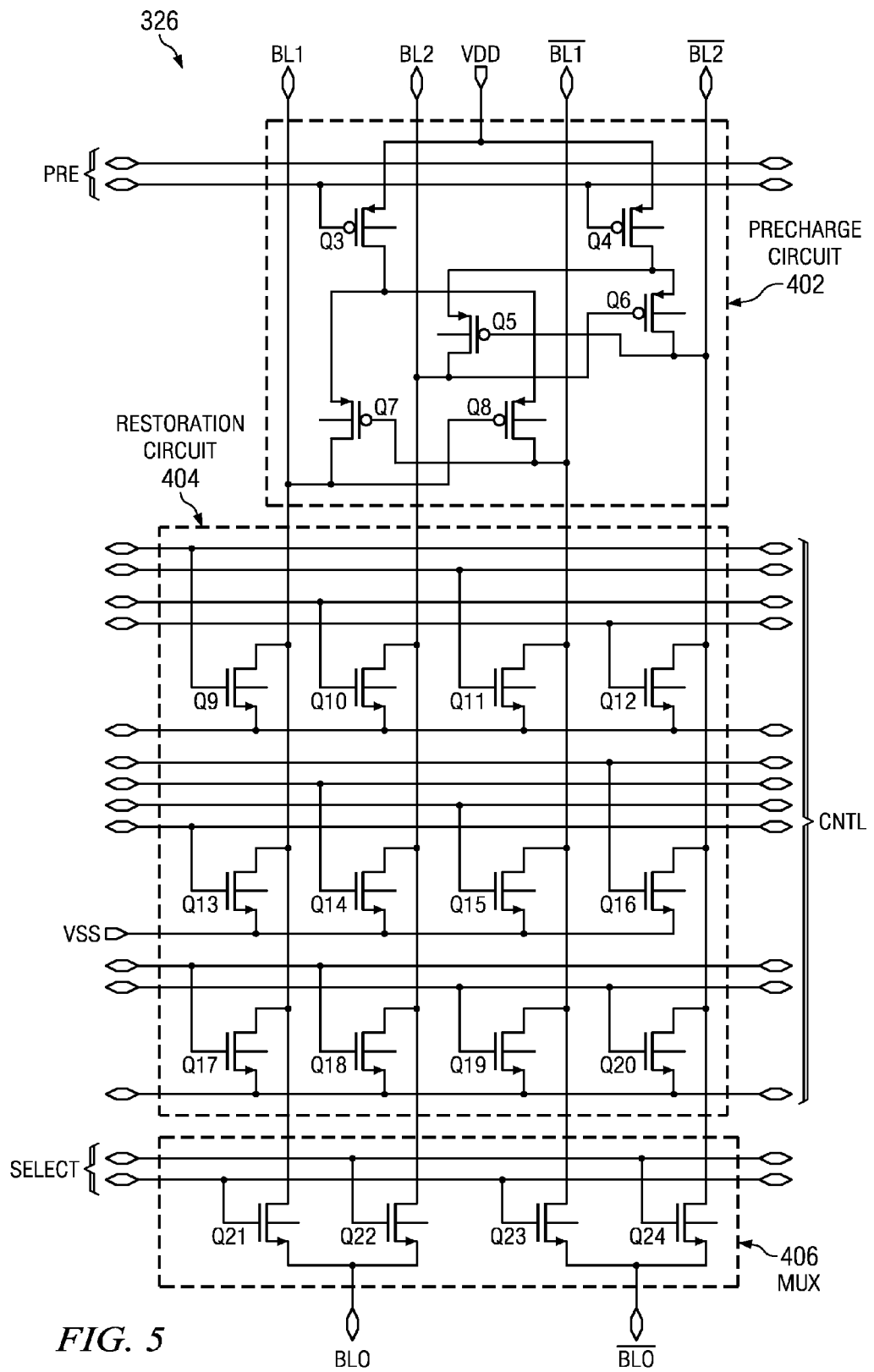
FIG. 5 is a diagram of an example of a bitline cell of FIG. 3.

With the bitline circuits (i.e., 312-1 and 312-2), it may be desirable for the bitline cells 326 to be shared by multiple sets of true and complement bitlines BL and $\overline{BL}$, although it is possible to employ one bitline cell 326 for each set of true and complement bitlines BL and $\overline{BL}$. As shown in the example of FIG. 5, a pair of true and complement bitlines BL1/$\overline{BL1}$ and BL2/$\overline{BL2}$ share bitline cell 324. For this example, bitline cell 324 generally comprises a precharge circuit 402 (which generally comprises transistors Q3 to Q8), a restoration circuit 404 (which generally comprises transistors Q9 to Q20), and a multiplexer or mux 406 (which generally comprises transistors Q21 to Q24). The precharge circuit 402 is generally controlled by controller 322 using the precharge signal PRE and is coupled to rail VDD so as to be able to precharge the bitlines BL1, BL2, $\overline{BL1}$, and $\overline{BL2}$. The restoration circuit 404 (which can generally provide some test functionality) is generally controlled by controller 322 with control signal CNTL and is coupled to rail VSS. The mux 406 is controlled by controller 322 with select signal SELECT, where the mux 406 can output states from true and complement bitlines BL1 and $\overline{BL1}$ or true and complement bitlines BL2 and $\overline{BL2}$ on output bitlines BLO and $\overline{BLO}$.

Figure 6:
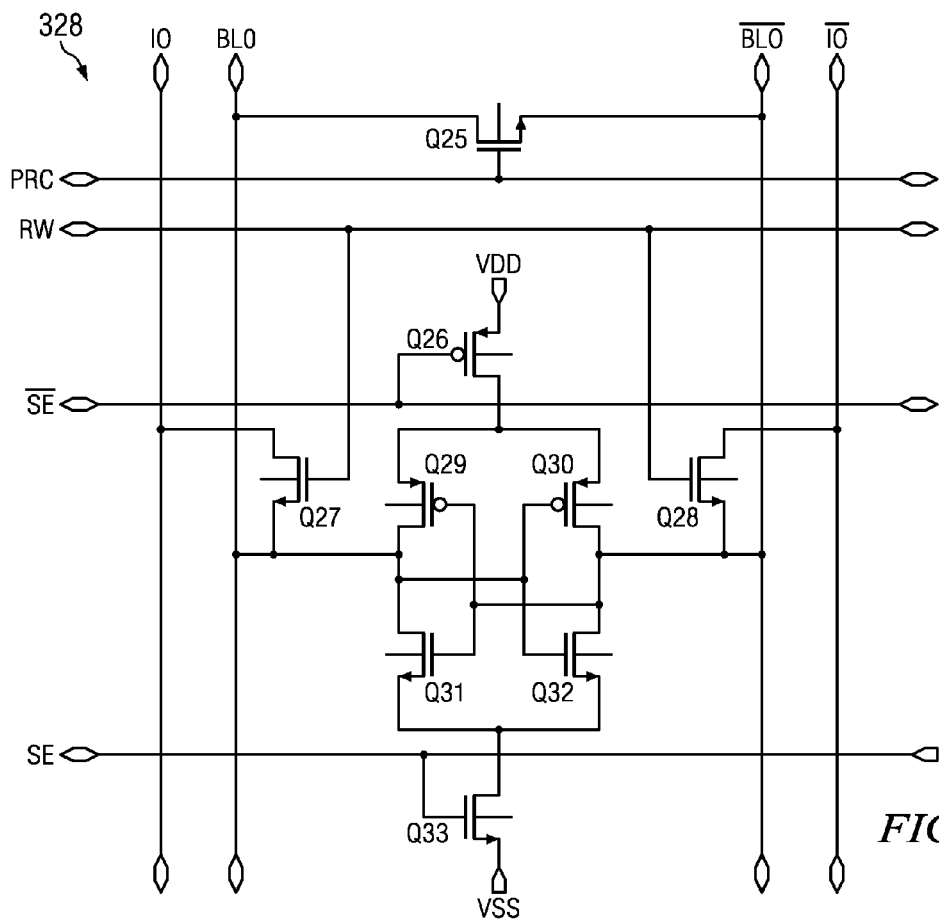
FIG. 6 is a diagram of an example of a sense amplifier of FIG. 3.

Typically, sense amplifiers 328 are coupled to a bitline cell 324 from each of a pair of bitline circuits 312-1 and 312-2, as shown in the example of FIG. 6. The sense amplifier 328 is generally comprised of transistors Q25 to Q28, and the sense amplifier 328 is usually enabled and disabled based on the sense enable signal SE (and its complement or inverse signal $\overline{SE}$) that is provided by controller 322. The sense amplifier 328 is also able to perform portions of read and write operations based on the state of the read/write signal RW (which is also generally provided by controller 322), and the bitlines BLO and $\overline{BLO}$ are able to be coupled together based on the state of signal PRC (which is also generally provided by controller).

Figure 7:
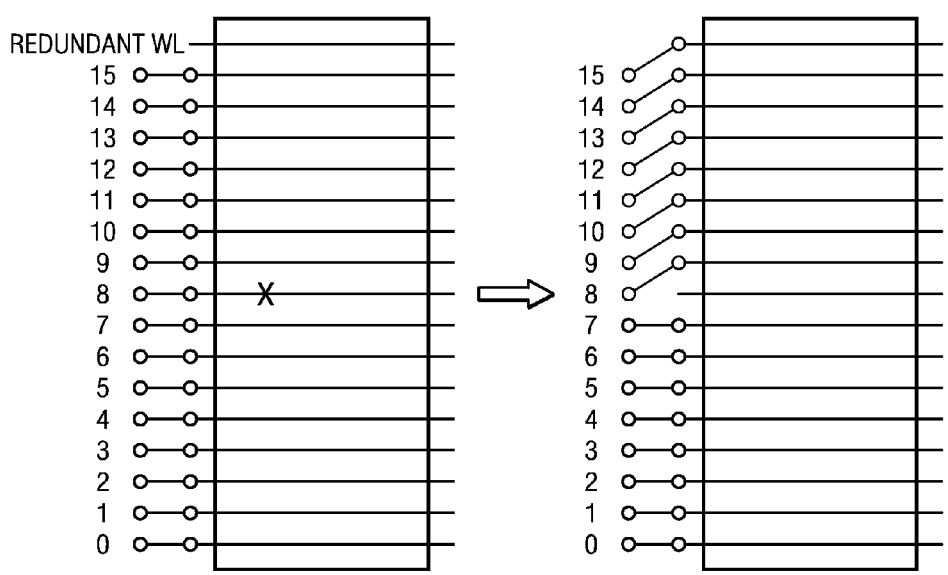
FIG. 7 is a diagram of an example of a row shift for the array segments of FIG. 3.

To increase the manufacturability and reliability, several other features (which can, for example, be seen in FIGS. 3 and 7-9) can be added to the cell arrays (i.e., 311-1 and 311-1). Usually, a strip of dummy FRAM cells (i.e., 324) can be included on the periphery of the cell array (i.e., 311-1 or 311-2) to reduce the effects of process gradients across the arrays (i.e., 311-1 or 311-2). Additionally, there may be an error or fault that can render a bitline (i.e., true and complement bitlines) or wordline unusable, so redundant bitlines and redundant wordlines are introduced into the arrays (i.e., 311-1 and 311-2). When a faulty bitline or wordline is detected, the array (i.e., 311-1 and 311-2) can be shifted (as shown in FIGS. 7 and 9). For wordline shifts, the row decoders (i.e., 304-1 and 304-2) can be equipped with a row shift circuit 400 (a portion of an example of which can be seen in FIG. 8). In this example, NAND gate 502 and inverter 504 generally operate as a shift control circuit (with signal REDZ being an active low signal indicating a shift) by generating signals SHIFT and SHIFTZ. The signals SHIFT and SHIFTZ are complementary or inverses of one another and are used to activate or deactivate drivers 506 and 508. For example, when signal REDZ is low or "0," driver 508 is deactivated, while driver 506 is activated. Additionally, signals SHIFTZ and REDZ can be used to control transistors Q34 and Q35 (which as shown are PMOS transistors) so as to be able to couple the output of driver (i.e., faulty wordline) to rail VDD. A similar circuit may also be provided for column shifting.

Figure 10:
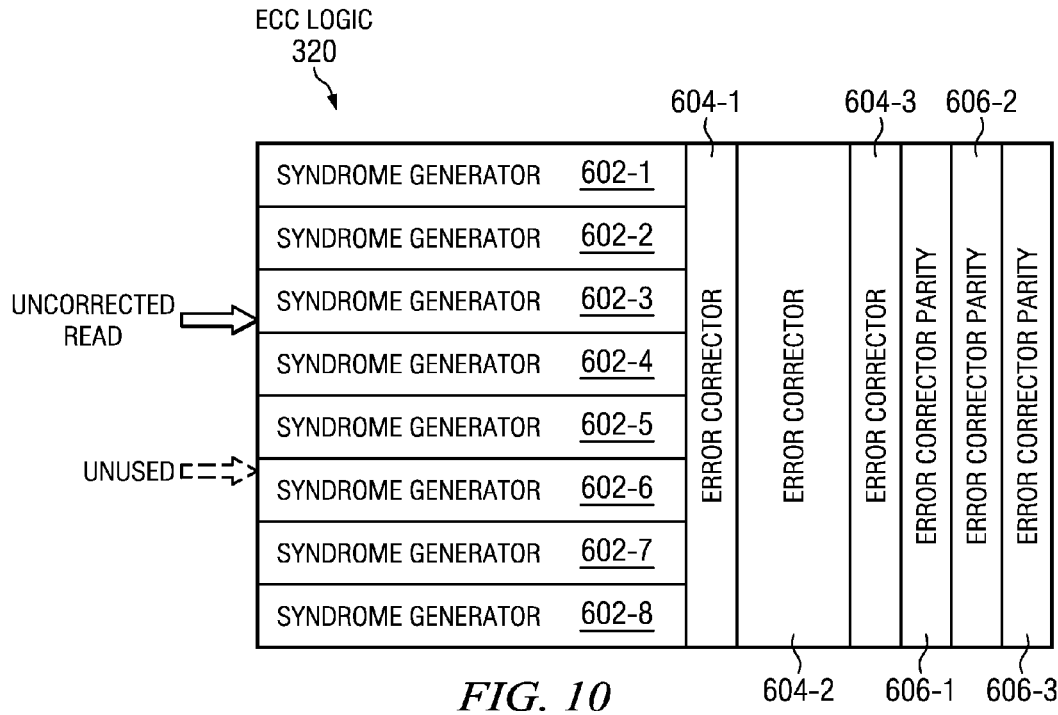
FIG. 10 is a diagram of an example of the error correcting code (ECC) logic circuit of FIG. 3.
Figure 11:
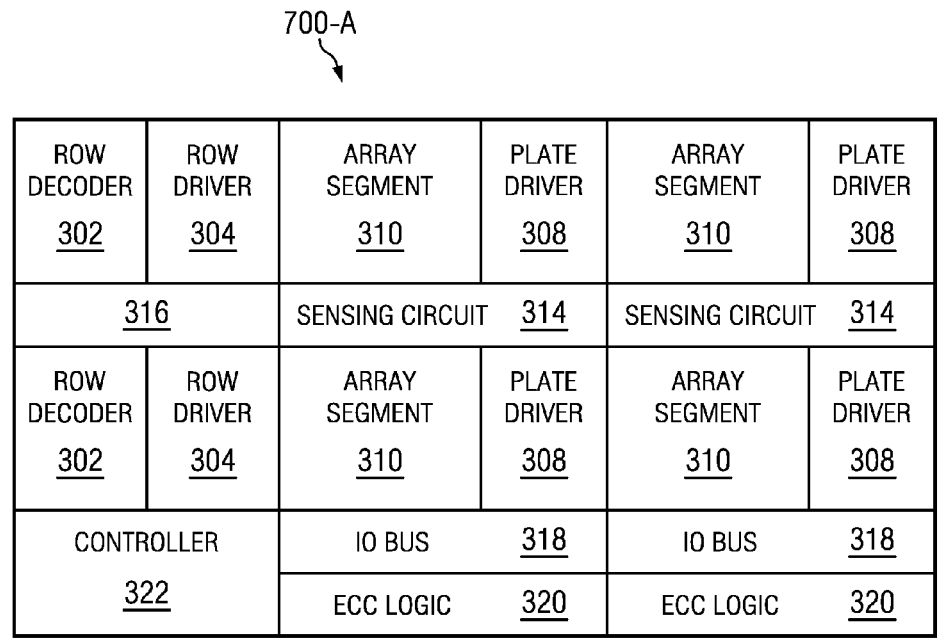
Figure 14:

Another factor in being able to generate a functional, scalable circuit 303 is the configuration of the ECC logic circuit 320 (an example of which can be seen in FIG. 10). As shown, ECC logic circuit 320 is generally comprised of syndrome generators 602-1 to 602-8, error corrector circuits 604-1 to 604-3, and error corrector parity circuits 606-1 to 606-3. For example, with a 64 bit word, 8 parity bits can be added, and a 64 bit, uncorrected read can be provided to syndrome generators 602-1 to 602-8. With this example, error corrector circuit 604-1 can perform error correction for first bit or least significant bit of the 64 bit word, and the error corrector circuits 604-2 and 604-3 perform error correction for the following 62 bits and the most significant bit (respectively). Additionally, for this example, error corrector parity circuits 606-1 to 606-3 perform error correction for first bit or least significant bit of the 8 parity bits, the following 6 bits, and the most significant bit of the 8 parity bits. Thus, ECC logic circuit 320 can produce a 64 bit corrected read for this example. Alternatively, for a 32 bit word, 7 parity bits can be added, and a 32 bit, uncorrected read can be provided to syndrome generators 602-1 to 602-8 (with unused inputs being coupled to rail VSS). With this example, error corrector circuit 604-1 can perform error correction for first bit or least significant bit of the 32 bit word, and the error corrector circuits 604-2 and 604-3 perform error correction for the following 30 bits and the most significant bit (respectively). Additionally, for this example, error corrector parity circuits 606-1 to 606-3 perform error correction for first bit or least significant bit of the 7 parity bits, the following 5 bits, and the most significant bit of the 7 parity bits. Thus, ECC logic circuit 320 can produce a 32 bit corrected read for this example.

Now turning to FIGS. 11-14, some examples of FRAM memory circuits 700-A to 700-D can be seen. FRAM memory circuits 700-A to 700-D can be generated by compiler 206 using the floorplan 210 (for use in an IC, for example). For each of these examples, the minimum size scalable circuit 303 (i.e., 1×1 aspect ratio) includes two array segments (which are labeled 310 for the sake of simplicity of illustration). Similarly, row decoder, row driver, plate driver, and sensing circuit are respectively labeled 304, 304, 308 and 314 for the sake of simplicity of illustration. As shown, FRAM memory circuits 700-A to 700-D have aspect ratios of 1×2, 1×4, 4×1, and 4×4, respectively, that result in different memory sizes, and the design rules 212 can include adaptations to the controller 322 (which can include timing, clocking, and IO circuitry) to accommodate these different sizes (i.e., up to, for example, 1 Mb) of FRAM memory circuits (i.e., 700-D), which can be specified by FRAM specifications. Examples of FRAM specifications (i.e., 202) can also be found in Table 1 below.

TABLE 1

| Aspect Ratio | Word Size | Bit Length | Size |
|---|---|---|---|
| 1 × 2 | 1024 | 64 bits | 8 kb |
| 1 × 4 | 2048 | 64 bits | 16 kb |
| 2 × 2 | 2048 | 64 bits | 16 kb |
| 1 × 8 | 4096 | 64 bits | 32 kb |
| 2 × 4 | 4096 | 64 bits | 32 kb |
| 4 × 2 | 4096 | 64 bits | 32 kb |
| 2 × 8 | 8192 | 64 bits | 64 kb |
| 4 × 4 | 8192 | 64 bits | 64 kb |
| 4 × 8 | 16384 | 64 bits | 128 kb |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
 a first array segment having:
 an first array of ferroelectric memory cells arranged into a first set of rows and a first set of columns, wherein each row from the first set of rows is associated with at least one bitline from a first set of bitlines and at least one plateline from a first set of platelines, and wherein each column from the first set of columns is associated with at least one wordline from a first set of wordlines; and
 a first set of bitline cells, wherein each bitline is coupled to at least one bitline from the first set of bitlines;
 a second array segment having:
 an second array of ferroelectric memory cells arranged into a second set of rows and a second set of columns, wherein each row from the second set of rows is associated with at least one bitline from a second set of bitlines and at least one plateline from a second set of platelines, and wherein each column from the second set of columns is associated with at least one wordline from a second set of wordlines; and
 a second set of bitline cells, wherein each bitline is coupled to at least one bitline from the second set of bitlines;
 a sensing circuit that is located between the first array segment and the second array segment, wherein the second circuit includes a plurality of sense amplifiers, and wherein each sense amplifier is coupled to at least one bitline from the first set of bitlines and it coupled to at least one bitline from the second set of bitlines;
 a first plate driver that is coupled to each plateline from the first set of platelines and that is located substantially adjacent to the first array segment;
 a second plate driver that is coupled to each plateline from the second set of platelines and that is located substantially adjacent to the second array segment;
 a first row interface circuit that is coupled to each wordline from the first set of wordlines and that is located substantially adjacent to at least one of the first plateline drivers and the first array segment;
 a second row interface circuit that is coupled to each wordline from the second set of wordlines and that is located substantially adjacent to at least one of the second plateline drivers and the second array segment;
 a wordline boost circuit that is coupled to the first and second row interface circuits and that is between the first and second row interface circuits;
 an input/output (IO) bus that is coupled to each sense amplifier and that is located substantially adjacent to at least one of the first and second array segments;
 an error correcting code (ECC) logic circuit that is coupled to and is substantially adjacent to the IO bus; and
 a controller that is coupled to the IO bus, the ECC logic, the sensing circuit, the first row interface circuit, and the second row interface circuit, wherein the controller is substantially adjacent to at least one of the first and second row interface circuits, the IO bus, and the ECC logic circuit.

2. The apparatus of claim 1, wherein each bitline cell further comprises a precharge circuit.

3. The apparatus of claim 2, wherein each bitline cell is coupled to a pair of bitlines, and wherein each bitline cell further comprises:
 the precharge circuit being coupled to its pair of bitlines; and a multiplexer that is coupled to the precharge circuit and its sense amplifier, wherein the multiplexer is controlled by the controller.

4. The apparatus of claim 3, wherein each bitline from the first and second sets of bitlines further comprises a true bitline and a complement bitline, and wherein each ferroelectric memory cell further comprises:
   a first MOS transistor that is coupled to its true bitline at its drain and its wordline at its gate;
   a first ferroelectric capacitor that is coupled between the source of the first MOS transistor and its plateline;
   a second MOS transistor that is coupled to its complement bitline at its drain and its wordline at its gate; and
   a second ferroelectric capacitor that is coupled between the source of the second MOS transistor and its plateline.

5. The apparatus of claim 4, wherein the ECC logic circuit further comprises:
   a plurality of syndrome generators that are coupled to receive an uncorrected read from the sensing circuit;
   a plurality of error corrector circuits; and
   a plurality of error corrector parity circuits, wherein the plurality of error corrector circuits and the plurality of error corrector parity circuits are coupled to the plurality of syndrome generators so as to generate a corrected read.

6. The apparatus of claim 5, wherein the first row interface circuit is adjacent to the first array segment, and wherein the second row interface circuit is adjacent to the second array segments.

7. A ferroelectric random access memory (FRAM) having a layout comprising:
   an shared circuit having:
      row interface circuitry located along an edge of the layout; and
      a controller that is coupled to the row interface circuitry, that is substantially adjacent to the row interface circuitry, and that is located at a corner of the layout; and
   a plurality of scalable circuits that are arranged in a array, wherein the array is adjacent to the row interface circuitry, wherein each scalable circuit includes:
      a first set of bitlines;
      a second set of bitlines;
      a first set of wordlines, wherein each wordline from the first set of wordlines is coupled to the row interface circuitry;
      a second set of wordlines, wherein each wordline from the second set of wordlines is coupled to the row interface circuitry;
      a first set of platelines;
      a second set of platelines;
      a first set of FRAM cells arranged into a first set of rows and a first set of columns, wherein each FRAM cell from the first set of FRAM cells is coupled to at least one bitline from the first set of bitlines, at least one wordline from the first set of wordlines, and at least one plateline from the first set of platelines;
      a second set of FRAM cells arranged into a second set of rows and a second set of columns, wherein each FRAM cell from the second set of FRAM cells is coupled to at least one bitline from the second set of bitlines, at least one wordline from the second set of wordlines, and at least one plateline from the second set of platelines;
      a first set of bitline cells, wherein each bitline is coupled to at least one bitline from the first set of bitlines;
      a second set of bitline cells, wherein each bitline is coupled to at least one bitline from the second set of bitlines;
      a plurality of sense amplifier, wherein each sense amplifier is coupled to at least one bitline from the first set of bitlines and it coupled to at least one bitline from the second set of bitlines, and wherein each sense amplifier is located between the first and second sets of FRAM cells;
      a first plate driver that is coupled to each plateline from the first set of platelines and that is located substantially adjacent to the first set of FRAM cells;
      a second plate driver that is coupled to each plateline from the second set of platelines and that is located substantially adjacent to the second set of FRAM cells;
   an IO bus that is coupled to each sense amplifier and that is located substantially adjacent to at least one of the first and second sets of FRAM cells; and
   an ECC logic circuit that is coupled to and is substantially adjacent to the IO bus; and
   a controller that is coupled to the IO bus, the ECC logic, the sensing circuit, the first row interface circuit, and the second row interface circuit, wherein the controller is substantially adjacent to at least one of the first and second row interface circuits, the IO bus, and the ECC logic circuit.

8. The FRAM of claim 7, wherein the first set of bitlines further comprises a first set of true bitlines and a first set of complement bitlines, and wherein the second set of bitlines further comprises a second set of true bitlines and a second set of complement bitlines.

9. The FRAM of claim 8, wherein each FRAM cells from the first and second setss of FRAM cells further comprises:
   a first NMOS transistor that is coupled to its true bitline at its drain and its wordline at its gate;
   a first ferroelectric capacitor that is coupled between the source of the first MOS transistor and its plateline;
   a second NMOS transistor that is coupled to its complement bitline at its drain and its wordline at its gate; and
   a second ferroelectric capacitor that is coupled between the source of the second MOS transistor and its plateline.

10. The FRAM of claim 9, wherein each bitline cell from the first and second setss of bitline cells further comprises:
   a precharge circuit that is coupled to true and complement bitlines from two adjacent rows in its associated set of FRAM cells; and
   a multiplexer that is coupled to the precharge circuit and its sense amplifier, wherein the multiplexer is controlled by the controller.

11. The FRAM of claim 10, wherein the row interface circuitry further comprises:
   a first row driver that is coupled to each first set of FRAM cells in a row of the arrays;
   a first row decoder that is coupled to the first row driver;
   a second row driver that is coupled to each second set of FRAM cells in the row of the array; and
   a second row decoder that is coupled to the second row driver; and
   a wordline boost circuit that is coupled to the first and second row drivers and that areis located between the first and second row drivers.

12. The FRAM of claim 11, wherein the ECC logic circuit further comprises:
   a plurality of syndrome generators that are coupled to receive an uncorrected read from its sensing circuit;
   a plurality of error corrector circuits; and a plurality of error corrector parity circuits, wherein the plurality of error corrector circuits and the plurality of error corrector parity circuits are coupled to the plurality of syndrome generators so as to generate a corrected read.

13. The FRAM of claim 12, wherein each of the first and second row drivers further comprises a row shifting circuit.

14. The FRAM of claim 13, wherein the bit length for the FRAM is 64 bits.

15. The FRAM of claim 14, wherein the array is one of a 1×2 array of scalable circuits, a 1×4 array of scalable circuits, a 2×2 array of scalable circuits, a 1×8 array of scalable circuits, a 2×4 array of scalable circuits, a 4×2 array of scalable circuits, a 2×8 array of scalable circuits, a 4×4 array of scalable circuits, and a 4×8 array of scalable circuits having respective word sizes of 1024 bits, 2048 bits, 2048 bits, 4096 bits, 4096 bits, 4096 bits, 8192 bits, 89192 bits, and 16384 and having a respective size of 8 kb, 16 kb, 16 kb, 32 kb, 32 kb, 32 kb, 64 kb, 64 kb, and 128 kb.

* * * * *